US011764294B2

(12) United States Patent
Yamanobe et al.

(10) Patent No.: US 11,764,294 B2
(45) Date of Patent: Sep. 19, 2023

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventors: Tomomi Yamanobe, Miyazaki (JP); Yoshinobu Takeshita, Miyazaki (JP); Kazutaka Kodama, Miyazaki (JP); Minako Oritu, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/280,250

(22) Filed: Feb. 20, 2019

(65) Prior Publication Data
US 2019/0259873 A1 Aug. 22, 2019

(30) Foreign Application Priority Data
Feb. 22, 2018 (JP) ................................. 2018-029528

(51) Int. Cl.
*H01L 29/78* (2006.01)
*H01L 29/40* (2006.01)
(Continued)

(52) U.S. Cl.
CPC ........ *H01L 29/7813* (2013.01); *H01L 21/266* (2013.01); *H01L 29/407* (2013.01);
(Continued)

(58) Field of Classification Search
None
See application file for complete search history.

(56) References Cited

U.S. PATENT DOCUMENTS

2004/0084721 A1  5/2004  Kocon et al.
2010/0065903 A1* 3/2010  Parthasarathy ..... H01L 29/7802
                                                              257/329
(Continued)

FOREIGN PATENT DOCUMENTS

JP  2011258834 A     12/2011
JP  2013214551 A     10/2013
JP  2019033109 A *   2/2019   ....... H01L 29/66734

OTHER PUBLICATIONS

Japanese Office Action dated Oct. 26, 2021, 2 pgs.

*Primary Examiner* — Steven M Christopher
(74) *Attorney, Agent, or Firm* — Volentine, Whitt & Francos, PLLC

(57) ABSTRACT

A semiconductor device including: a first semiconductor layer having a first conductive type; a second semiconductor layer provided on the first semiconductor layer, the second semiconductor layer having a second conductive type that is a conductive type different from the first conductive type; an impurity region of the first conductive type formed at a surface of the second semiconductor layer; first electrodes contacting the impurity region, the second semiconductor layer, and the first semiconductor layer via a first insulating film; and second electrodes contacting the first electrodes via a second insulating film, and contacting the first semiconductor layer via a third insulating film, the second electrodes including PN junctions at borders between upper portions that contact the first semiconductor layer via the third insulating film and lower portions that contact the first semiconductor layer via the third insulating film.

3 Claims, 9 Drawing Sheets

(51) Int. Cl.
    *H01L 21/266*    (2006.01)
    *H01L 29/417*    (2006.01)
    *H01L 29/66*     (2006.01)

(52) U.S. Cl.
    CPC .. *H01L 29/41741* (2013.01); *H01L 29/66712* (2013.01); *H01L 29/7804* (2013.01)

(56) References Cited

U.S. PATENT DOCUMENTS

| | | | |
|---|---|---|---|
| 2010/0117144 A1 | 5/2010 | Hirler et al. | |
| 2013/0062688 A1* | 3/2013 | Kobayashi | H01L 29/0878 257/330 |
| 2013/0137230 A1* | 5/2013 | Blank | H01L 29/7813 438/270 |
| 2015/0349091 A1* | 12/2015 | Yilmaz | H01L 29/4975 438/270 |
| 2015/0380403 A1* | 12/2015 | Kotsar | H01L 29/7811 257/334 |
| 2016/0020315 A1* | 1/2016 | Hirler | H01L 29/0878 257/330 |
| 2016/0260829 A1* | 9/2016 | Aichinger | H01L 29/7813 |

\* cited by examiner

FIG.6
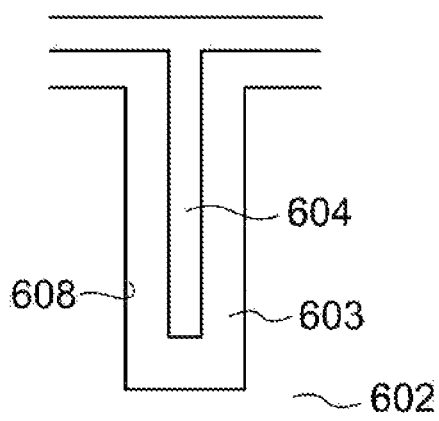
(1)
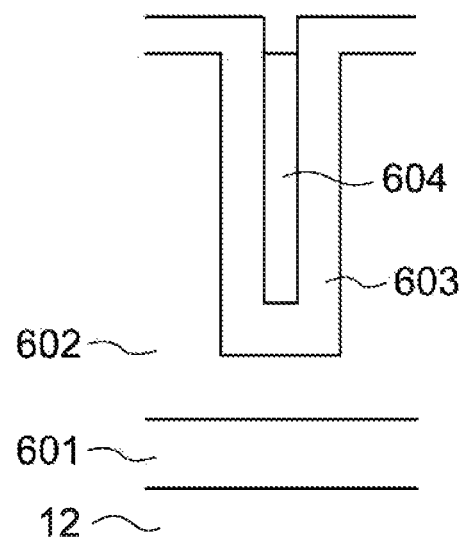
(2)
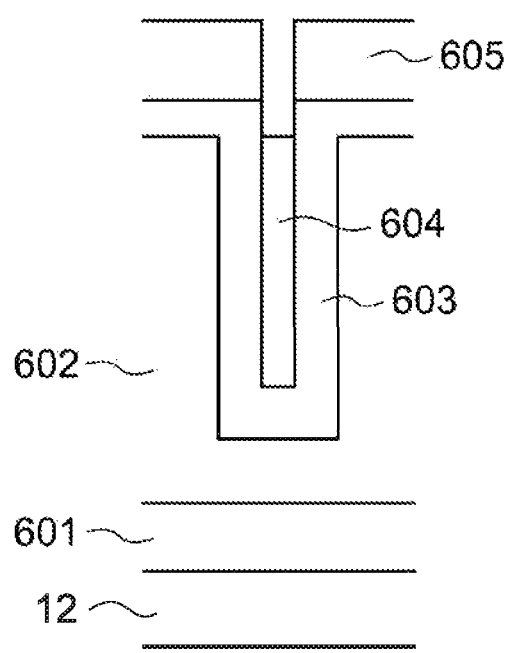
(3)
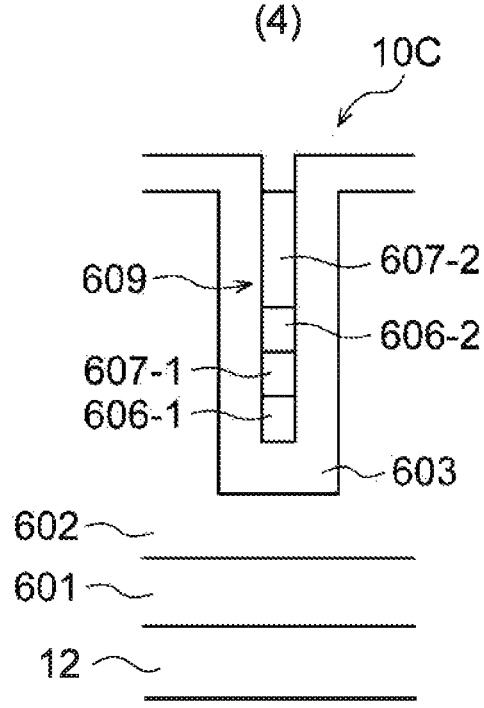
(4)

FIG.7
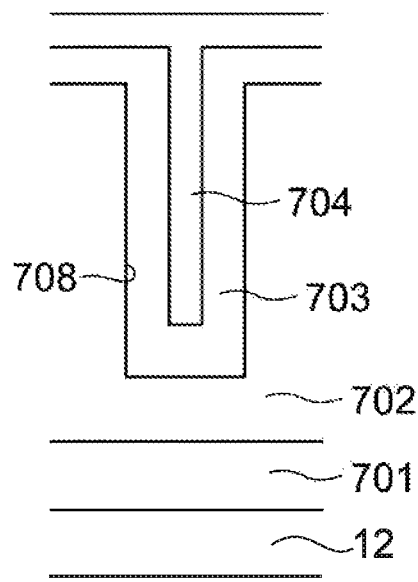
(1)
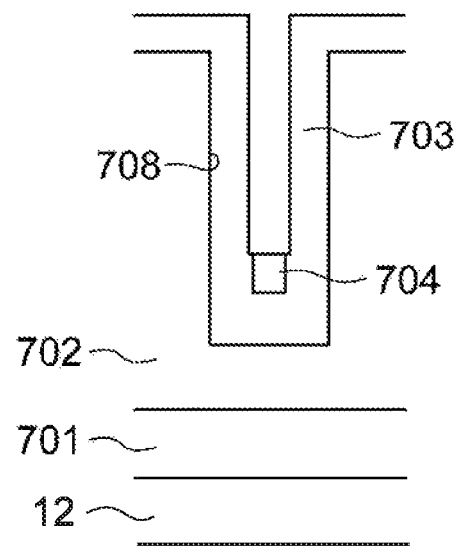
(2)
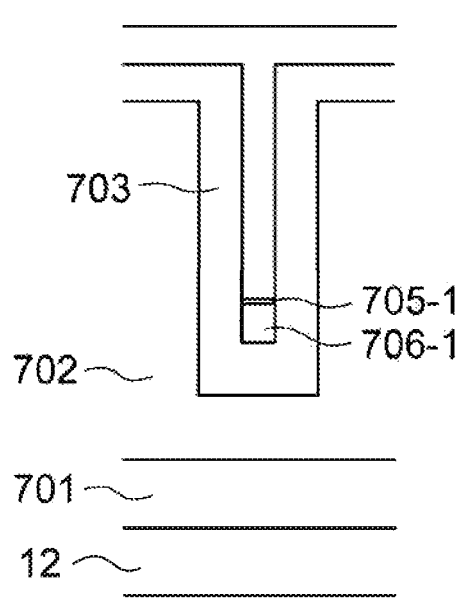
(3)
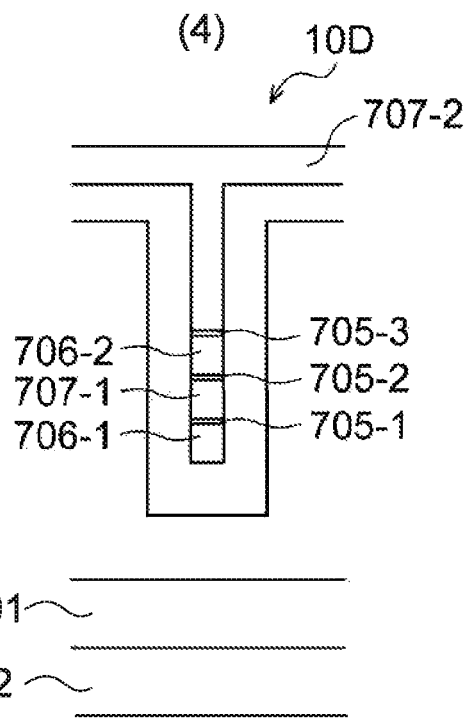
(4)

SEMICONDUCTOR DEVICE AND SEMICONDUCTOR DEVICE MANUFACTURING METHOD

CROSS-REFERENCE TO RELATED APPLICATION

This application claims priority under 35 USC 119 from Japanese Patent Application No. 2018-029528, filed on Feb. 22, 2018, the disclosure of which is incorporated by reference herein.

BACKGROUND

Technical Field

The present disclosure relates to a semiconductor device and a semiconductor device manufacturing method, and in particular, to a high voltage semiconductor device and a high voltage semiconductor device manufacturing method.

Related Art

In a high voltage semiconductor device, improvement in the withstand voltage and a decrease in the ON resistance are required. An embedded field plate structure has been proposed as a method for realizing an increase in the withstand voltage and a lowering of the ON resistance of a high voltage semiconductor device. In an embedded field plate structure, trenches are provided in the drift layer, the potential of the field plates embedded within the trenches is fixed, and, by extending the depletion layer from the trench side walls into the drift layer, the interior of the drift layer is completely depleted, and a high voltage is realized.

As a conventional semiconductor device, for example, Japanese Patent Application Laid-Open (JP-A) No. 2011-258834 discloses a semiconductor device that has a field plate structure for rising the withstand voltage. In the semiconductor device disclosed in JP-A No. 2011-258834, a P type well region and an N+ type source layer region are selectively provided at the surface layer of an N type drift region, and trenches, which contact the N+ type source layer region and pass-through the P type well region and reach the N type drift region, are provided. Field plates are provided at the interiors of these trenches via a first insulating film. Further, gate electrodes are provided at the interiors of the trenches above the field plates and via a second insulating film. The first insulating film has a thickness that is greater than or equal to the film thickness of the second insulating film. N type low concentration regions, which span from the corner portions of the trenches to the bottom surfaces and cover the bottom surfaces of the trenches, are provided at the interior of the N type drift region. Namely, in the semiconductor device disclosed in JP-A No. 2011-258834, by providing the N type low concentration regions in vicinities of the bottom surfaces of the trenches, extending of the depletion layer in vicinities of the bottom surfaces of the trenches is promoted, and the electric field is mitigated, and a decrease in the withstand voltage is thereby prevented.

Further, as a conventional semiconductor device having a field plate structure, for example, JP-A No. 2013-214551 is known. In the semiconductor device disclosed in JP-A No. 2013-214551, an N type drift layer and a P type base layer are provided at a second surface side of an N+ type semiconductor substrate. Trenches that pass-through the P type base layer and reach the N type drift layer are provided. Further, in-trench source electrodes and gate electrodes are embedded in the trenches. The in-trench source electrodes are fixed to the potential of an external source electrode. In a case in which voltage is applied to a drain electrode 20 that is at a first surface side of the N+ type semiconductor electrode, field plate oxide films within the trenches become capacitance components, and accumulates charges.

As a result, the depletion layer broadens from the side walls of the trench, and the interior of the N type drift layer is completely depleted. Due thereto, the electric potential gradient of the N type drift layer is equalized, and electric field concentration at the interface of the P type base layer and the N type drift layer is mitigated. Thus, the impurity concentration of the N type drift layer can be made to be high, and lowering of the ON resistance can be realized while maintaining the withstand voltage.

However, in the semiconductor device disclosed in JP-A No. 2011-258834, after impurities are implanted into the trench bottom surfaces after the trenches are formed, the N type low concentration regions are formed by a heat treatment. Therefore, variations in the impurity concentrations of the N type low concentration regions, which are due to dispersion in the implantation amounts that arises at the time of implanting impurities into the trench bottom surfaces, or due to impurities being taken-into the first insulating film of the trench bottom surfaces in a heat treatment in a step thereafter, arise. As a result, it is difficult to control the impurity concentration at the N type low concentration regions that controls the extending of the depletion layer, and thus, the withstand voltages in the manufactured products may vary (reproducibility of the withstand voltage being low).

On the other hand, in the semiconductor device according to JP-A No. 2013-214551, in a case in which drain voltage is applied, it is easy for an electric field to concentrate at the trench bottom portion, and, if the voltage specifications are high, it is difficult to obtain the desired withstand voltage. Namely, it is easy for electric field concentration to arise at the trench bottom portion, and breakdown may occur. In order to solve the above, it is necessary to decrease the potential difference applied to the insulating film of the trench bottom portion, without deteriorating the function of the trench as a field plate.

SUMMARY

The present disclosure provides, in a semiconductor device having field plates, a semiconductor device and a semiconductor device manufacturing method that may suppress a decrease in the withstand voltage due to electric field concentration at the trench bottom portions.

A first aspect of the present disclosure is a semiconductor device including: a first semiconductor layer having a first conductive type; a second semiconductor layer provided on the first semiconductor layer, the second semiconductor layer having a second conductive type that is a conductive type different from the first conductive type; an impurity region of the first conductive type formed at a surface of the second semiconductor layer; first electrodes contacting the impurity region, the second semiconductor layer, and the first semiconductor layer via a first insulating film; and second electrodes contacting the first electrodes via a second insulating film, and contacting the first semiconductor layer via a third insulating film, the second electrodes including PN junctions at borders between upper portions that contact the first semiconductor layer via the third insulating film and lower portions that contact the first semiconductor layer via the third insulating film.

A second aspect of the present disclosure is a semiconductor device manufacturing method, including: forming a first semiconductor layer having a first conductive type at a main surface of a semiconductor substrate; forming first opening portions at an interior of the first semiconductor layer; forming an insulating film at bottom surface portions and side wall portions of the first opening portions, and forming concave portions; forming first electrodes having the first conductive type at bottom surface portions of the concave portions; forming second electrodes having a second conductive type at upper portions of the first electrodes, the second conductive type is a conductive type different from the first conductive type; forming third electrodes at an interior of the insulating film; forming a second semiconductor layer having the second conductive type at the first semiconductor layer at peripheries of the first opening portions; and forming an impurity region having the first conductive type at an upper portion of the second semiconductor layer.

According to the above aspects, the present disclosure provides, in a semiconductor device having field plates, a semiconductor device and a semiconductor device manufacturing method that may suppress a decrease in the withstand voltage due to electric field concentration at the trench bottom portions.

BRIEF DESCRIPTION OF THE DRAWINGS

Exemplary embodiments will be described in detail based on the following figures, wherein:

FIG. 6 is cross-sectional views illustrating manufacturing steps of a semiconductor device according to a third exemplary embodiment;

FIG. 7 is cross-sectional views illustrating manufacturing steps of a semiconductor device according to a fourth exemplary embodiment;

DETAILED DESCRIPTION

Exemplary embodiments of the present disclosure are described in detail hereinafter with reference to the drawings. In the semiconductor devices and a semiconductor device manufacturing method according to the present exemplary embodiments, as a structure for improving the withstand voltage, a structure is employed in which PN junction diodes are provided at the end portions of field plates, lowering of the voltage due to reverse bias is caused, and due thereto, electric field concentration at the trench bottom portions is mitigated. Namely, in accordance with the semiconductor devices and a semiconductor device manufacturing method according to the present exemplary embodiments, by providing PN junctions at the bottom portions of the field plates, a lowering of voltage is caused only at the end portions of the field plates, and a decrease in the withstand voltage may be suppressed. Further, because the impurity profile within an N− type drift layer becomes uniform, the reproducibility becomes high, and stable withstand voltage may be ensured.

First Exemplary Embodiment

Figure 1:
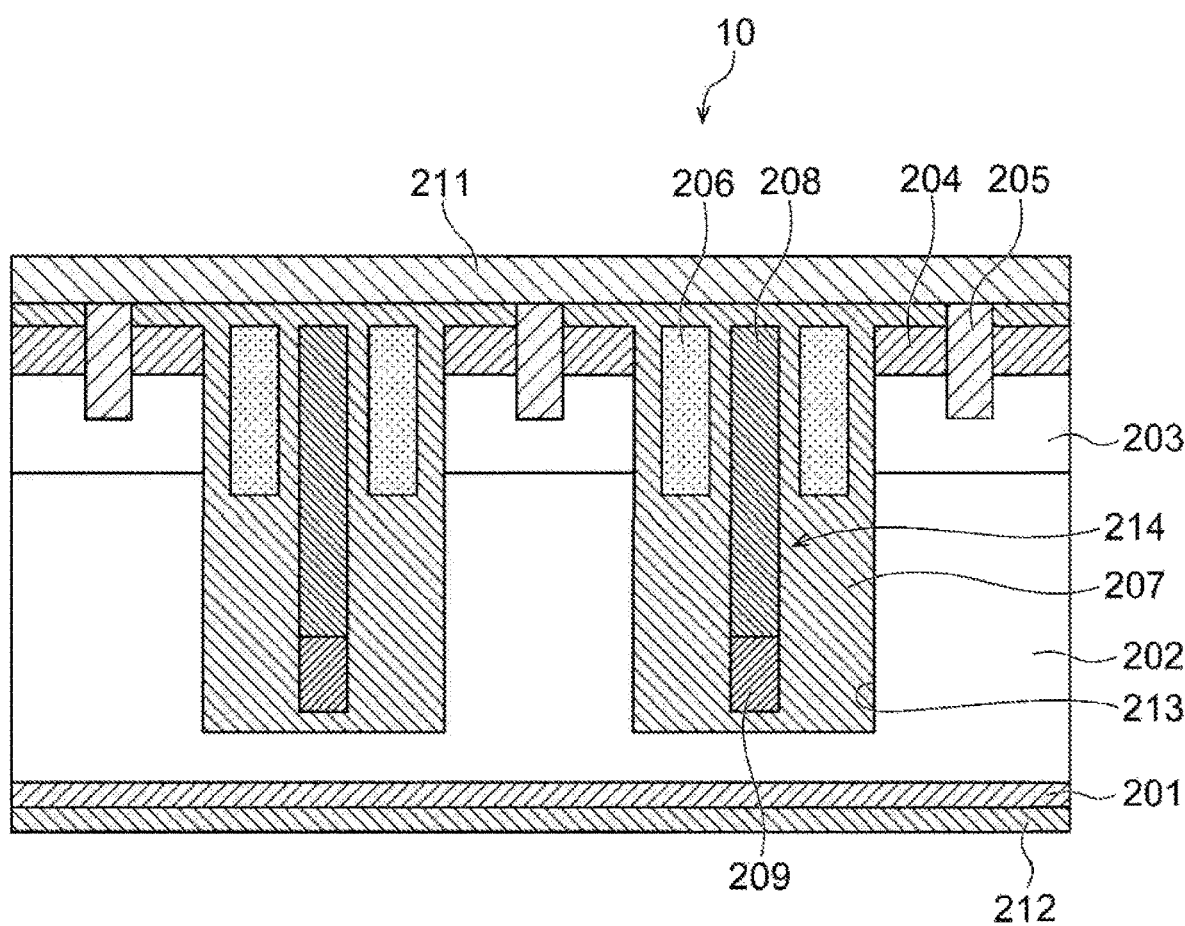
FIG. 1 is a cross-sectional view of a semiconductor device according to a first exemplary embodiment.

A semiconductor device 10 according to the present exemplary embodiment is described with reference to FIG. 1 and FIG. 2. In the present exemplary embodiment, an N type silicon substrate (see FIG. 2) is used as an example of the substrate. As shown in FIG. 1, the semiconductor device 10 includes a drain electrode 212, an N+ type drain layer 201, an N− type drift layer 202, a P type body layer 203, an N+ type source layer 204, contact electrodes 205, gate electrodes 206, an insulating film 207, P type field plates 208, N type field plates 209, and a source electrode 211. The source electrode 211 is connected to the N+ type source layer 204 via the contact electrodes 205. The drain electrode 212 is connected to the N+ type drain layer 201. Namely, the semiconductor device 10 is structured as a vertical type MOS FET (Field Effect Transistor) having a vertical type field plate structure. Note that the "+" that is added to the N means that the impurity concentration is higher than that of a layer to which a "+" is not added, and the "−" that is added to the N means that the impurity concentration is lower than that of a layer to which a "−" is not added.

The N− drift layer 202 is the flow path of current in the ON state, and is a region that mainly bears the withstand voltage in the OFF state. Namely, at the N− type drift layer 202, at the time in a case in which reverse voltage is applied, the depletion layer extends and holds the withstand voltage. The P type body layer 203 functions as a P type well. The insulating film 207 functions to separate the gate electrodes 206 from the source electrode 211 and the drain electrode 212.

The embedded type field plate 214 according to the present exemplary embodiment is embedded within a trench 213 that is formed in the N type silicon substrate together with the gate electrodes 206, and the periphery of the field plate 214 is covered by the insulating film 207. The field plate 214 has the P type field plate 208 that is formed of polysilicon to which P type impurities are added, and the N type field plate 209 that is formed of polysilicon to which N type impurities are added. Further, the P type field plate 208 and the N type field plate 209 are formed so as to contact one another. As a result, a PN junction diode is formed at the side near the lower end portion of the field plate 214. Note that the P type field plate 208 is made to be the same potential as the potential of the N+ type source layer 204 (is short-circuited to the N+ type source layer 204).

A semiconductor device manufacturing method 10 is described next with reference to FIG. 2.

First, the semiconductor substrate 12 whose material is N type silicon is provided, and an N+ type drain layer 301 and an N− type drift layer 302 are formed.

Next, trenches 311 are formed within the N− type drift layer 302 by using a mask at which the pattern of the trenches is reversed. For example, silicon oxide is used as the material of the mask. ((1) of FIG. 2.) The width of the trenches 311 is, for example, from 1.0 to 1.5 μm, and the depth of the trenches 311 is, for example, from 5 to 6 μm.

Figure 2:
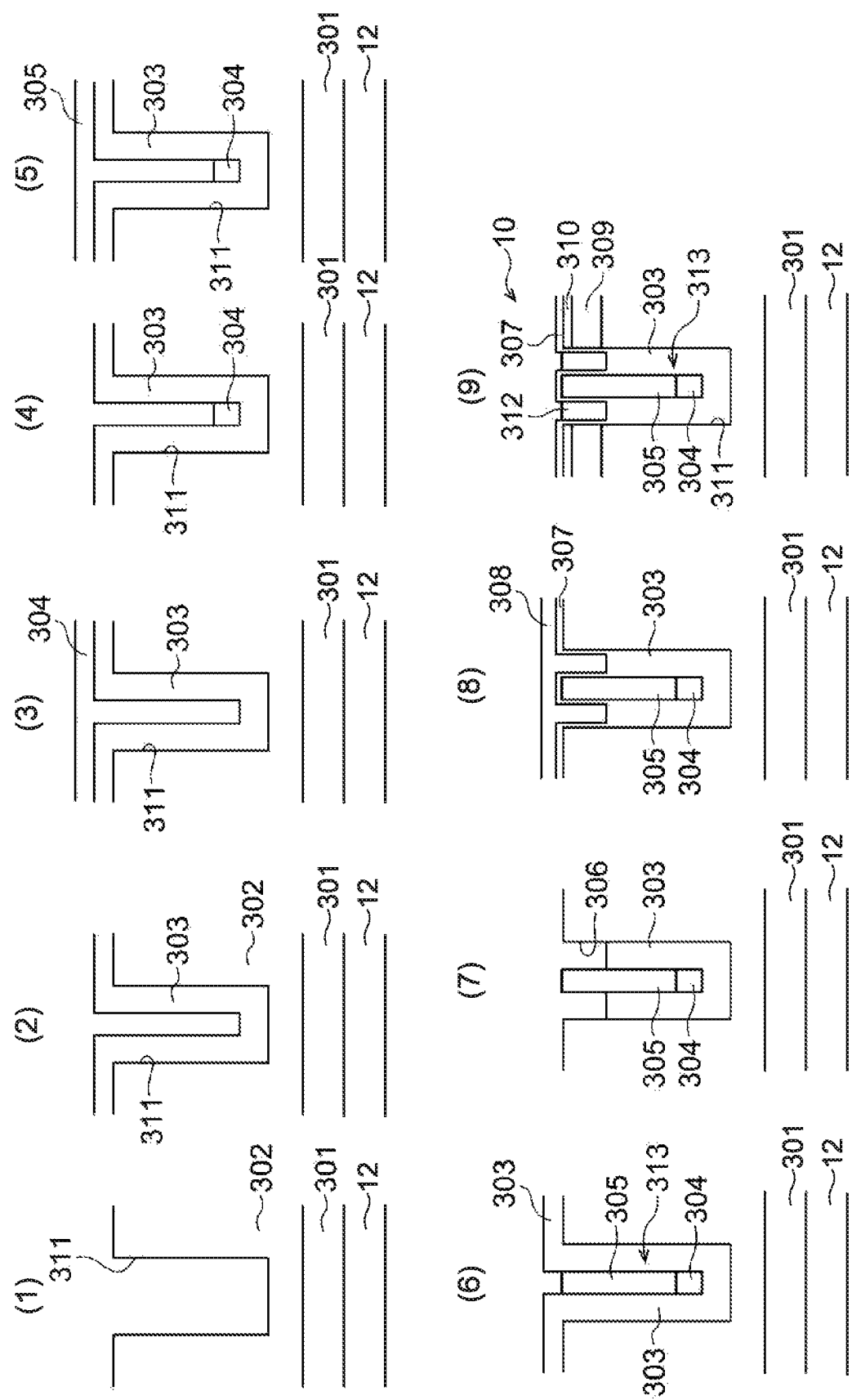
FIG. 2 is cross-sectional views illustrating manufacturing steps of the semiconductor device according to the first exemplary embodiment.

Next, an insulating film 303 is formed on the surface of the semiconductor substrate 12 and the side walls and the bottom portions of the trenches 311 ((2) of FIG. 2). For example, a heat insulating film or an LP-TEOS (Low-Pressure Tetraethyl Orthosilicate) film is used as the insulating film 303.

Next, an N type polysilicon layer 304 that is formed of an N type polysilicon is filled into the trenches 311. At this time, the trenches 311 are completely filled-in with the polysilicon ((3) of FIG. 2).

Next, the N type polysilicon layer 304 is etched-back and removed, and is left only at the bottom portions of the trenches 311 ((4) of FIG. 2).

Next, a P type polysilicon layer 305 that is formed of a P type polysilicon is filled into the trenches 311. At this time, the trenches 311 are completely filled-in with the polysilicon ((5) of FIG. 2).

Next, the P type polysilicon layer 305 is etched-back to the same position as the surface (the main surface) of the semiconductor substrate 12 ((6)) of FIG. 2). Field plates 313 according to the present exemplary embodiment are formed by the N type polysilicon layer 304 and the P type polysilicon layer 305.

Next, portions of the insulating film 303 are etched-back and removed, and gate trenches 306 are formed. In the etching-back at this time, the insulating film 303 is etched-back to a depth of, for example, 1.0 to 1.2 μm from the surface (the main surface) of the semiconductor substrate 12, and portions of the insulating film 303 are left ((7) of FIG. 2).

Next, a gate oxide film 307 is formed on the surface (the main surface) of the semiconductor substrate 12 and the side walls and the bottom portions of the gate trenches 306, and thereafter, polysilicon 308 is filled into the gate trenches 306 ((8) of FIG. 2).

Next, the polysilicon 308 is etched-back to a position that is lower than the surface (the main surface) of the semiconductor substrate 12, and gate electrodes 312 are formed ((9) of FIG. 2).

Next, by using a mask at which the pattern of the trenches 311 is reversed, P type impurities (e.g., boron or the like) are implanted-in from the surface (the main surface) of the semiconductor substrate 12, and, moreover, thermal diffusion is carried out, and a P type body layer 309 is formed ((9) of FIG. 2).

Next, by using a mask at which the pattern of the trenches 311 is reversed, N type impurities (e.g., arsenic or the like) are implanted-in from the surface (the main surface) of the semiconductor substrate 12, and moreover, thermal diffusion is carried out, and an N+ type source layer 310 is formed ((9) of FIG. 2).

The semiconductor device 10 according to the present exemplary embodiment is manufactured through the above-described manufacturing steps. Note that the N− type drift layer 302, the P type body layer 309, the N+ type source layer 310, the gate electrodes 312, the insulating film 303, the P type polysilicon layer 305, the N type polysilicon layer 304 and the field plates 313 in (9) of FIG. 2 respectively correspond to the N− type drift layer 202, the P type body layer 203, the N+ type source layer 204, the gate electrodes 206, the insulating film 207, the P type field plates 208, the N type field plates 209 and the field plates 214 that are shown in FIG. 1.

As described above in detail, in the semiconductor device and the semiconductor device manufacturing method according to the present exemplary embodiment, polysilicon into which impurities are introduced is used at the embedded type field plates 214. Further, the N type field plates 209 are provided at the end portions of the P type field plates 208. As a result, the field plates 214 structure PN junction diodes. At this time, the P type field plates 208 short-circuit to the potential of the N+ type source layer 204.

Further, in a case in which the polysilicon electrodes formed by the P type field plates 208 of the field plates 214 shown in FIG. 1 are grounded (are connected to ground (GND)) and positive voltage is applied to the drain electrode 212, the polysilicon electrodes formed by the N type field plates 209 that are positioned at the end portions of the field plates 214 become a potential that is between GND and the positive voltage that is applied to the drain electrode 212. Therefore, the PN junctions become reverse bias, and lowering of the voltage arises only at the end portions (the N type field plates 209) of the field plates 214. Namely, the potential of the end portions (the field plates 214) of the field plates 214 becomes a potential that is between the source potential and the drain potential. As a result, the potential applied to the bottom portions of the trenches 213 becomes weak, and a decrease in the withstand voltage may be suppressed. Due thereto, the withstand voltage may be improved by changing the structure of the field plates, without changing the basic structures of the conventional semiconductor devices.

<Modified Example of First Exemplary Embodiment>

Figure 3:
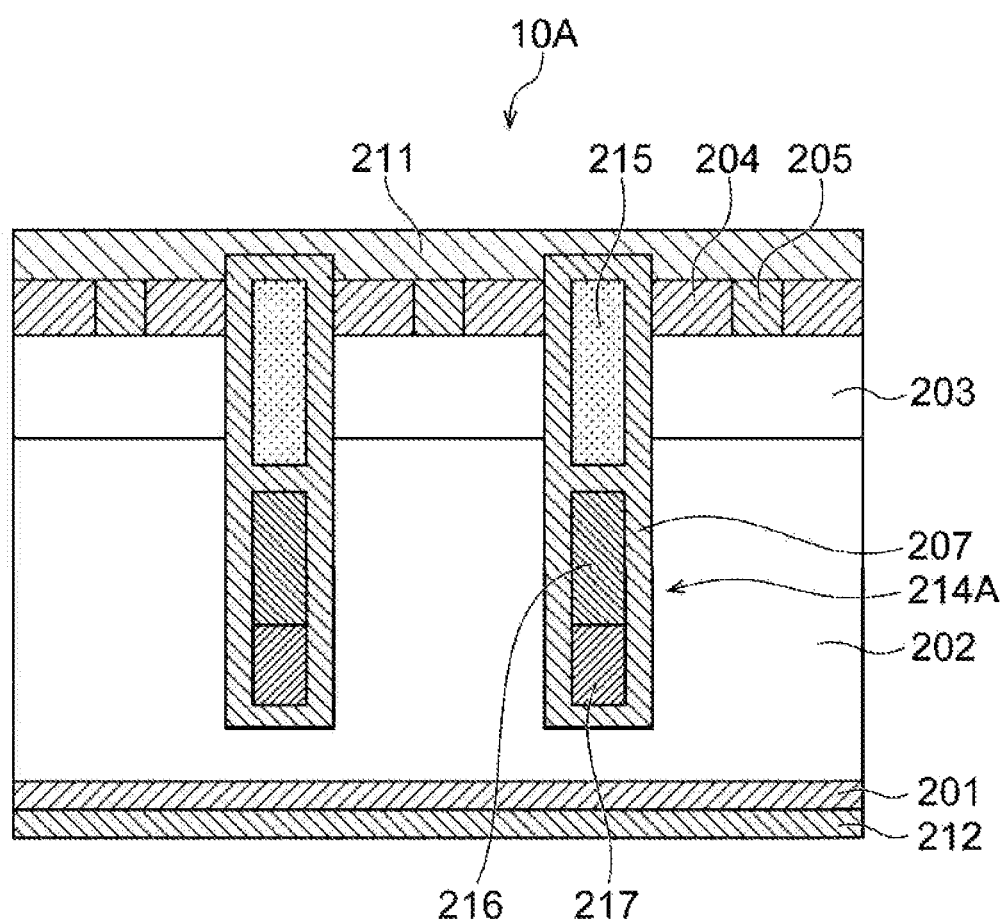
FIG. 3 is a cross-sectional view of a semiconductor device according to a modified example of the first exemplary embodiment.

A semiconductor device 10A according to the present exemplary embodiment is described with reference to FIG. 3. The semiconductor device 10A is of a form in which, at the above-described semiconductor device 10, the gate electrodes 206 are replaced by gate electrodes 215, and the P type field plates 208 and the N type field plates 209 are replaced by P type field plates 216 and N type field plates 217 respectively, and the field plates 214 are replaced by field plates 214A. Accordingly, structures that are similar to those of the semiconductor device 10 are denoted by the same reference numerals, and detailed description thereof is omitted.

The gate electrodes 215, the P type field plates 216 and the N type field plates 217 of the semiconductor device 10A also are similar to semiconductor device 10 with respect to the point of being embedded within the insulating film 207. However, the semiconductor device 10A differs from the semiconductor device 10 with regard to the point that, as shown in FIG. 3, the gate electrodes 215, the P type field plates 216 and the N type field plates 217 are arrayed in the vertical direction. The field plate 214A is structured by the P type field plate 216 and the N type field plate 217. Even if the gate electrodes 215, the P type field plates 216 and the N type field plates 217 (the field plates 214A) are disposed as shown in FIG. 3, effects that are similar to those of the above-described semiconductor device 10 may be exhibited. Note that the semiconductor device 10A can be manufactured in accordance with the above-described semiconductor device manufacturing method 10.

Second Exemplary Embodiment

A semiconductor device 10B according to the present exemplary embodiment is described with reference to FIG. 4 and FIG. 5. In the semiconductor device 10B, two of each of the P type field plates and the N type field plates are disposed. Accordingly, structures that are similar to those of the semiconductor device 10 are denoted by the same reference numerals, and detailed description thereof is omitted.

Figure 4:
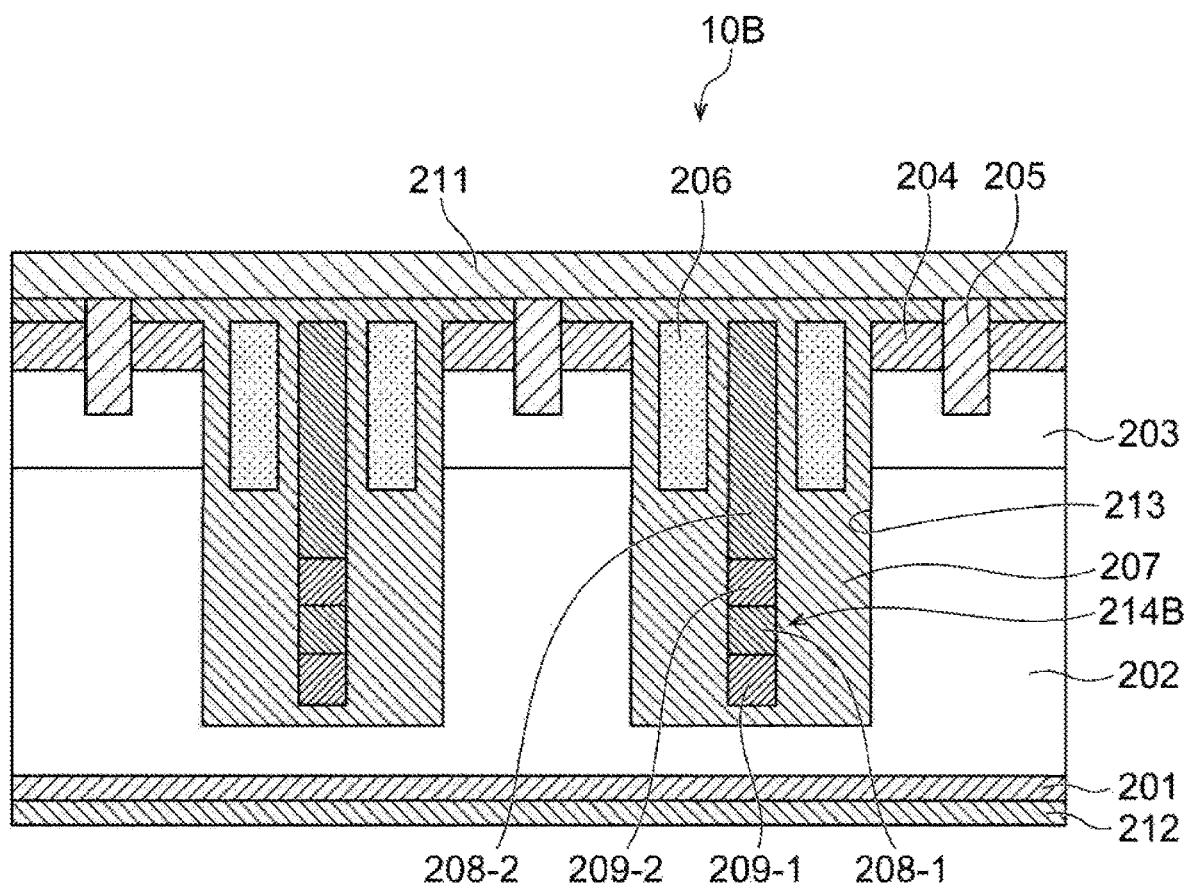
FIG. 4 is a cross-sectional view of a semiconductor device according to a second exemplary embodiment.

As shown in FIG. 4, the semiconductor device 10B has P type field plates 208-1, 208-2 and N type field plates 209-1, 209-2. A field plate 214B is structured by the P type field plates 208-1, 208-2 and the N type field plates 209-1, 209-2.

In the above-described semiconductor device 10, one PN junction is provided in order to lower the end portion of the field plate. However, in the semiconductor device 10B according to the present exemplary embodiment, two PN junctions are provided. Namely, a repeating structure of N type, P type, N type, P type is provided from the endmost portion (the lowermost end portion) of the polysilicon that is used for the field plate 214B. Due thereto, the potential of the end portion (the N type field plate 209-1) of the field plate 214B can be lowered more. Note that the present exemplary embodiment describes, as an example, a form in which two of each of the P type field plates 208 and N type field plates 209 are provided, but the present disclosure is not limited to this and may be a form in which three or more of each of the P type field plate 208 and N type field plate 209 are provided. Namely, the number of the repeating structure of P type, N type can be set freely in accordance with the desired withstand voltage.

Figure 5:
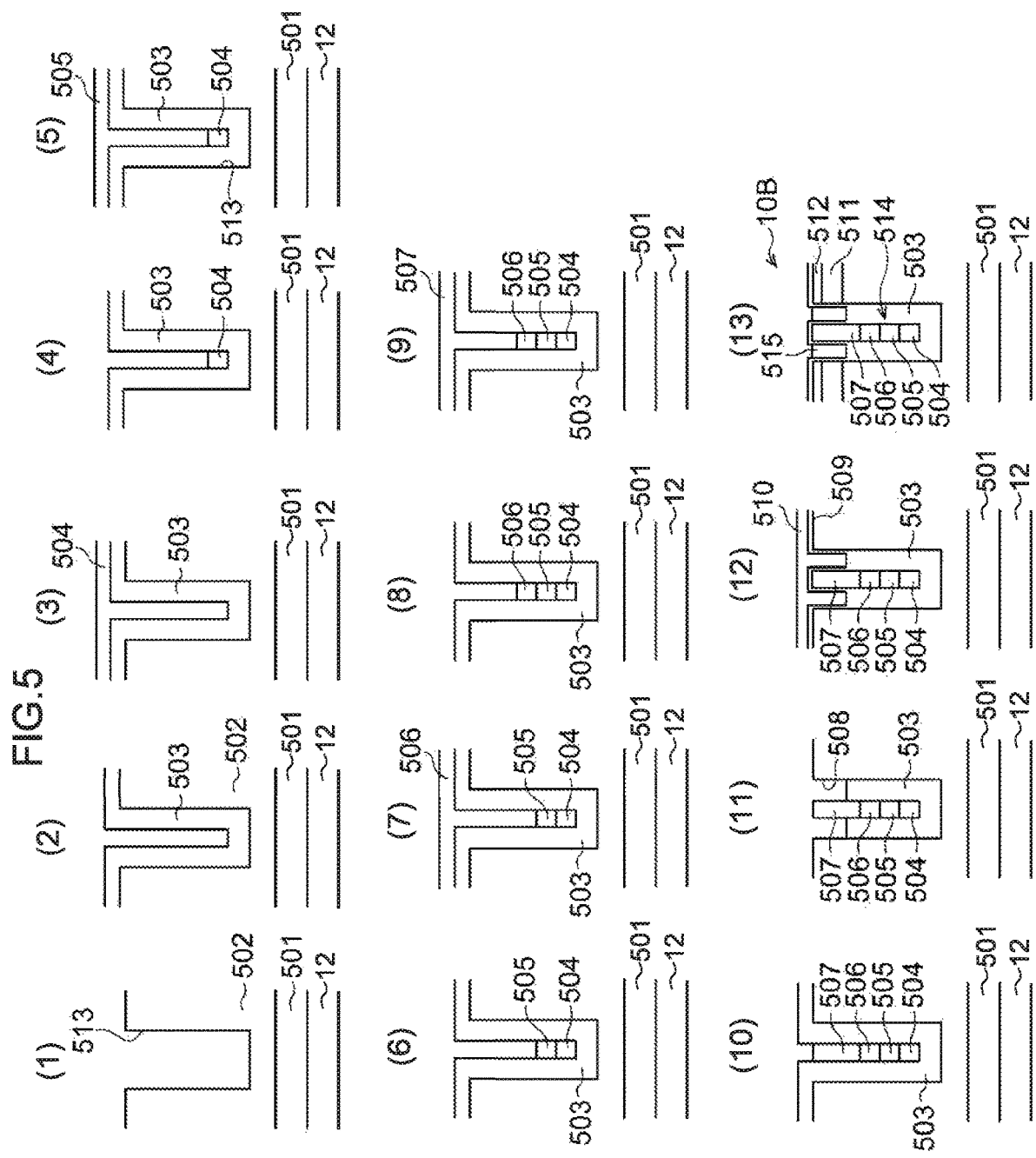
FIG. 5 is cross-sectional views illustrating manufacturing steps of the semiconductor device according to the second exemplary embodiment.

The semiconductor device manufacturing method 10B according to the present exemplary embodiment is descried next with reference to FIG. 5.

First, the semiconductor substrate 12 whose material is N type silicon is provided, and an N+ type drain layer 501 and an N− type drift layer 502 are formed. Thereafter, in the same way as (1) through (4) of FIG. 2, an N type polysilicon layer 504 is formed ((1) through (4) of FIG. 5).

Next, a P type polysilicon layer 505 is filled into trenches 513. At this time, the interiors of the trenches 513 are completely filled-in with the polysilicon ((5) of FIG. 5).

Next, the P type polysilicon layer 505 is etched-back and removed, and is left at the top portions of the N type polysilicon layer 504 that is at the bottom portions of the trenches 513 ((6) of FIG. 5).

Next, an N type polysilicon layer 506 is filled into the trenches 513. At this time, the interiors of the trenches 513 are completely filled-in by the polysilicon ((7) of FIG. 5).

Next, the N type polysilicon layer 506 is etched-back and removed, and is left at the bottom portions of the trenches 513 ((8) of FIG. 5).

Next, a P type polysilicon layer 507 is filled into the trenches 513. At this time, the interiors of the trenches 513 are completely filled-in by the polysilicon ((9) of FIG. 5).

Next, the P type polysilicon layer 507 is etched-back to the same position as the surface (the main surface) of the semiconductor substrate ((10) of FIG. 5).

Next, the semiconductor device 10B, which has a gate oxide film 509, polysilicon 510 (gate electrodes 515), a P type body layer 511, an N+ source layer 512 and field plates 514, is formed ((11), (12), (13) of FIG. 5), in the same way as (7), (8), (9) of FIG. 2. Reference numeral 508 in (11) of FIG. 5 denotes a gate trench. Here, in a case in which there are three or more PN junctions, is suffices to further repeat the steps shown in (5) of FIG. 5 through (8) of FIG. 5. Note that the N-type drift layer 502, the P type body layer 511, the N+ type source layer 512, the gate electrode 515, an insulating film 503, and the field plate 514 in (13) of FIG. 5 respectively correspond to the N− type drift layer 202, the P type body layer 203, the N+ type source layer 204, the gate electrodes 206, the insulating film 207 and the field plates 214 that are shown in FIG. 4.

In accordance with the semiconductor device 10B, the potential difference between the end portion of the field plate 214B shown in FIG. 4 and the drain potential is smaller, and a decrease in the withstand voltage may be suppressed more effectively. Namely, the withstand voltage may be improved by changing the structure of the field plate, without changing the basic structures of the conventional semiconductor devices. The greater the number of the repeating structures of N type, P type, the lower the potential of the end portion of the field plate 214B (mainly, the N type field plate 209-1 portion), and the greater the electric field mitigating effect at he bottom portion of the trench 213. On the other hand, in a case in which the potential of the end portion of the field plate 214B becomes too low, the formation of the depletion layer in the vicinity of the bottom portion of the trench 213 may become inhibited. Accordingly, the function of the trench as a field plate may not be exhibited sufficiently. Therefore, the number of the repeating structure of N type, P type is not limited, and may be selected freely in accordance with the desired specifications (the withstand voltage and the like), while also taking this aspect into consideration.

Third Exemplary Embodiment

A semiconductor device 10C and a semiconductor device manufacturing method 10C according to the present exemplary embodiment are described with reference to FIG. 6. The present exemplary embodiment uses ion implantation in the formation of the PN diodes.

The steps of the formation of an N+ type drain layer 601, an N− type drift layer 602 and trenches 608, the formation of an insulating film 603, and up through the filling of polysilicon 604, are similar to those of (1) through (3) of FIG. 5 ((1) of FIG. 6).

Next, the polysilicon 604 is etched-back to the same position as the surface (the main surface) of the semiconductor substrate 12 ((2) of FIG. 6).

Next, portions other than the field plate formation portions are protected by a photoresist 605 ((3) of FIG. 6).

Via the photoresist 605, P type impurities and N type impurities are implanted with the energy amounts thereof being varied, and plural PN diodes are built into the positions that will become the end portions of the field plates ((4) of FIG. 6). The example of (4) of FIG. 6 illustrates a case of forming two PN diodes, and P type field plates 607-1, 607-2 and N type field plates 606-1, 606-2 are formed. Field plates 609 according to the present exemplary embodiment are structured by the P type field plates 607-1, 607-2 and the N type field plates 606-1, 606-2. The manufacturing steps after the removal of the photoresist 605 are similar to (11) through (13) of FIG. 5.

In the semiconductor device manufacturing method 10B that is shown in FIG. 5, at the time of layering the N type and P type field plate electrodes within the field plates, etching-back processing must be carried out plural times. In contrast, in accordance with the semiconductor device and the a semiconductor device manufacturing method according to the present exemplary embodiment, the N type and P type field plate electrodes are built-in by carrying out implantation processes of different ion types and energy amounts. Accordingly, and therefore, the present exemplary embodiment may sufficiently to carry out etching-back process by a single time.

Fourth Exemplary Embodiment

A semiconductor device 10D and a semiconductor device manufacturing method 10D according to the present exemplary embodiment are described with reference to FIG. 7. In the present exemplary embodiment, a layered oxide film is formed between the P type field plate and the N type field plate.

The steps ((1) of FIG. 7) of the formation of an N+ type drain layer 701, an N− type drift layer 702 and trenches 708, the formation of an insulating film 703, and up through the filling of polysilicon 704, are similar to (1) through (3) of FIG. 5.

Next, the N type polysilicon layer 704 that is filled in the trenches 708 is etched-back, and the N type polysilicon layer 704 is left at the bottom portions of the trenches 708. The N type polysilicon layer 704 that remains at this time becomes N type field plates 706-1. Thereafter, the insulating film 703 is etched-back while taking the film thickness of the layered oxide film into consideration ((2) of FIG. 7).

Next, by CVD (Chemical Vapor Deposition) for example, an oxide film is layered, and a layered oxide film 705-1 is formed ((3) of FIG. 7).

Next, a P type polysilicon layer is formed, and moreover, etching-back of the P type polysilicon layer is carried out, and P type field plates 707-1 are formed. Next, etching-back of the insulating film 703 is carried out, a layered oxide film 705-2 is formed, an N type polysilicon layer is formed, etching-back of the N type polysilicon layer is carried out, N type field plates 706-2 are formed, etching-back of the insulating film 703 is carried out, a layered oxide film 705-3 is formed, a P type polysilicon layer is filled-in, and P type field plates 707-2 are formed ((4) of FIG. 7). Manufacturing steps thereafter are in accordance with (10) through (13) of FIG. 5.

In accordance with the semiconductor device 10D and the semiconductor device manufacturing method 10D according to the present exemplary embodiment, oxide films are formed between the N type field plates and the P type field plates. Therefore, the N type field plates and P type field plates may be made to be floating electrodes.

Fifth Exemplary Embodiment

A semiconductor device 10E and a semiconductor device manufacturing method 10E according to the present exemplary embodiment are described with reference to FIG. 8. The semiconductor device 10E and the semiconductor device manufacturing method 10E are modified examples of the above-described semiconductor device 10B and semiconductor device manufacturing method 10B.

First, the semiconductor substrate 12 whose material is N type silicon is provided, and an N+ type drain layer 801 and an N− type drift layer 802 are formed.

Figure 8:
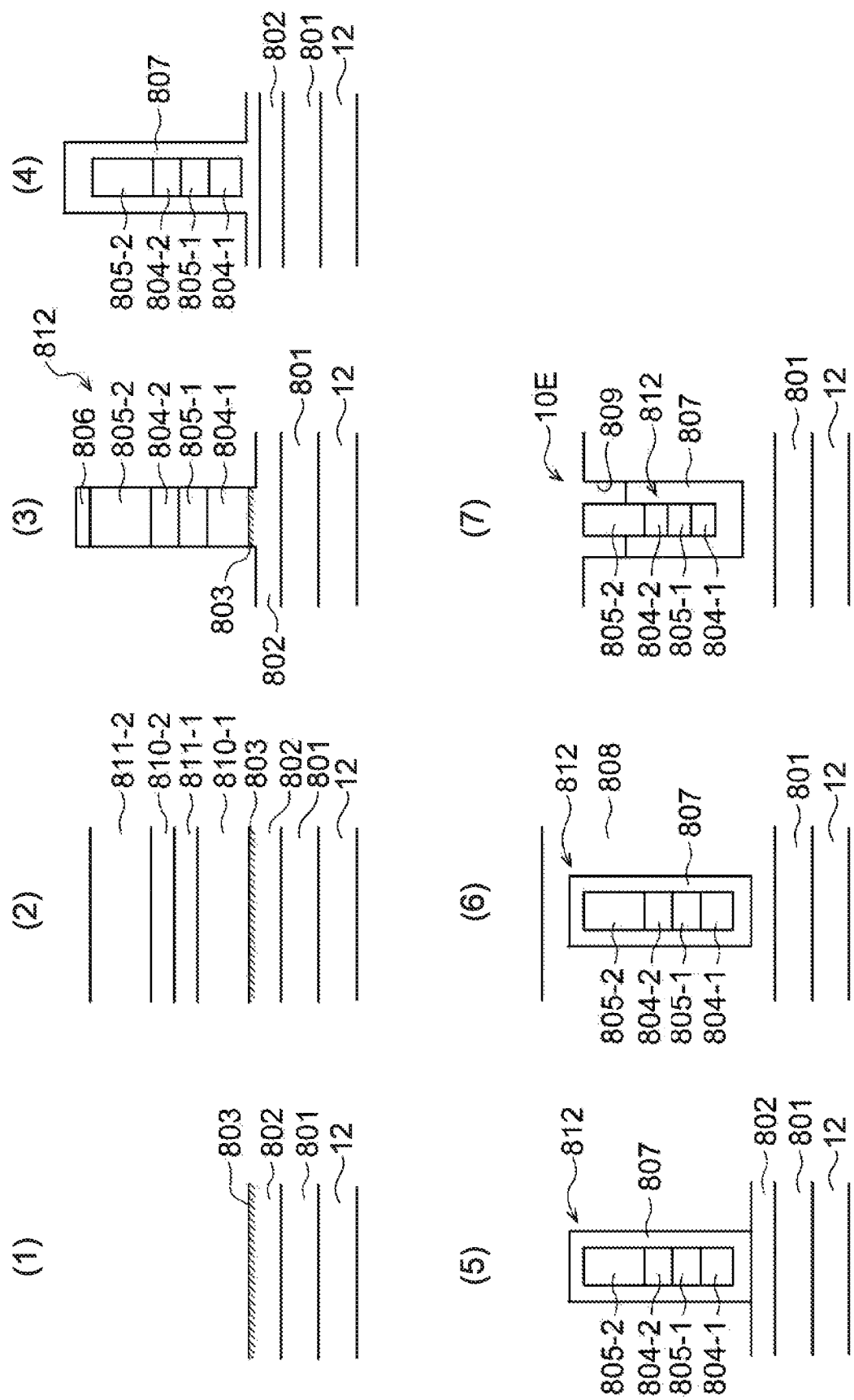
FIG. 8 is cross-sectional views illustrating manufacturing steps of a semiconductor device according to a fifth exemplary embodiment.

Next, oxygen is implanted into the entire upper surface of the N− type drift layer 802, and an oxygen impurity layer 803, at which oxygen is the impurity, is formed at the surface of the N− type drift layer 802 ((1) of FIG. 8).

Next, an N type epitaxial layer 810-1, a P type epitaxial layer 811-1, an N type epitaxial layer 810-2 and a P type epitaxial layer 811-2 are formed in that order on the N− type drift layer 802 that forms the oxygen impurity layer 803 ((2) of FIG. 8).

Next, the epitaxial layer other than at the field plate formation portions is removed by dry etching, and pillar-shaped PN junction diodes are formed. At this time, an oxide film 806 is used as a hard mask, and dry etching is carried out, and thereafter, in a state in which the oxide film 806 remains, the process is moved onto the next step ((3) of FIG. 8). N type field plates 804-1, 804-2, P type field plates 805-1, 805-2 are formed by the pillar-shaped PN junction diodes that are formed by the present step. The N type field plates 804-1, 804-2 and the P type field plates 805-1, 805-2 structure field plates 812 according to the present exemplary embodiment.

Next, an oxide film 807 is formed by thermal oxidation for example, so as to cover the N type field plates 804-1, 804-2 and the P type field plates 805-1, 805-2. At this time, because the impurity layer of oxygen exists between the N type field plate 804-1 and the N− type drift layer 802, the oxide film is formed also at the bottom portion of the field plate 812 ((4) of FIG. 8).

Next, the oxide film 807 is etched-back, the oxide film that is on the N− type drift layer 802 is removed, and the N− type drift layer 802 is exposed ((5) of FIG. 8). At this time, at the upper portions of the field plates 812 (the pillar-shaped PN junction diodes), the oxide film has been made thicker by an amount corresponding to the thickness of the hard mask (the oxide film 806) at the time of the dry etching. Therefore, the oxide film remains also after etching-back. The outer peripheries of the field plates 812 (the pillar-shaped PN junction diodes) are all in states of being covered by the oxide films 807.

Next, an N type epitaxial layer 808 is formed In the initial stage of epitaxial growth, the epitaxial growth proceeds in the vertical direction from the N− type drift layer 802. In a case in which the epitaxial layer reaches the upper portion of the field plate 812 (the pillar-shaped PN junction diode), epitaxial growth proceeds in the lateral direction as well, and the field plate 812 (the pillar-shaped PN junction diode) is covered by the N type epitaxial layer 808, and the field plate 812 becomes an embedded field plate ((6) of FIG. 8).

Next, the N type epitaxial layer 808 is etched-back until the oxide films at the upper portions of the field plates 812 are exposed. Thereafter, the oxide film 807 is etched-back ((7) of FIG. 8). Reference numeral 809 in (7) of FIG. 8 denotes a gate trench. The manufacturing steps thereafter are in accordance with (12), (13) of FIG. 5. Note that the N type epitaxial layer 808 is connected to the N− type drift layer 802, and becomes a portion of the N− type drift layer 802.

In the semiconductor device and the semiconductor device manufacturing method of the present exemplary embodiment, the characteristics of the PN junction diodes within the field plates 812 that are embedded in the oxide films 807 can be easily controlled. Namely, the diodes that structure the field plates 812 that are embedded in the oxide films 807 are formed by epitaxial growth. Therefore, there is the effect that diodes of the desired characteristics may be formed by adjusting the thickness of the epitaxial layer and the concentration of the epitaxial layer.

Sixth Exemplary Embodiment

A semiconductor device 10F and a semiconductor device manufacturing method 10F according to the present exemplary embodiment are described with reference to FIG. 9.

In the second exemplary embodiment that is shown in FIG. 4 and FIG. 5, after the insulating films 503 are formed at the interiors of the trenches 513, polysilicon layers are formed, etching-back is repeated, and the desired PN layered structure is formed. However, in accordance with the present manufacturing method, the film thickness of the polysilicon must be controlled by the etching-back, and that the number of steps may increase in a case in which the number of PN layerings increases.

In contrast, in the present exemplary embodiment, after insulating films are formed at the interiors of the trenches, polysilicon layers are layered in accordance with the desired number of PN layerings. Due thereto, control of the thickness of the polysilicon is easy. Thereafter, after the PN layered structure is formed in a desired pattern, the insulating film at the sides of the trenches is etched-back, and portions that become the gate electrodes are formed. Due thereto, the number of etching-back steps for forming the PN layered structure may be reduced, and the number of steps may be reduced.

First, the semiconductor substrate 12 whose material is N type silicon is provided, and an N+ type drain layer 901 and an N− type drift layer 902 are formed. Thereafter, trenches 903 of widths of 1 μm for example are formed at the interior of the N− type drift layer 902 ((1) of FIG. 9).

Figure 9:
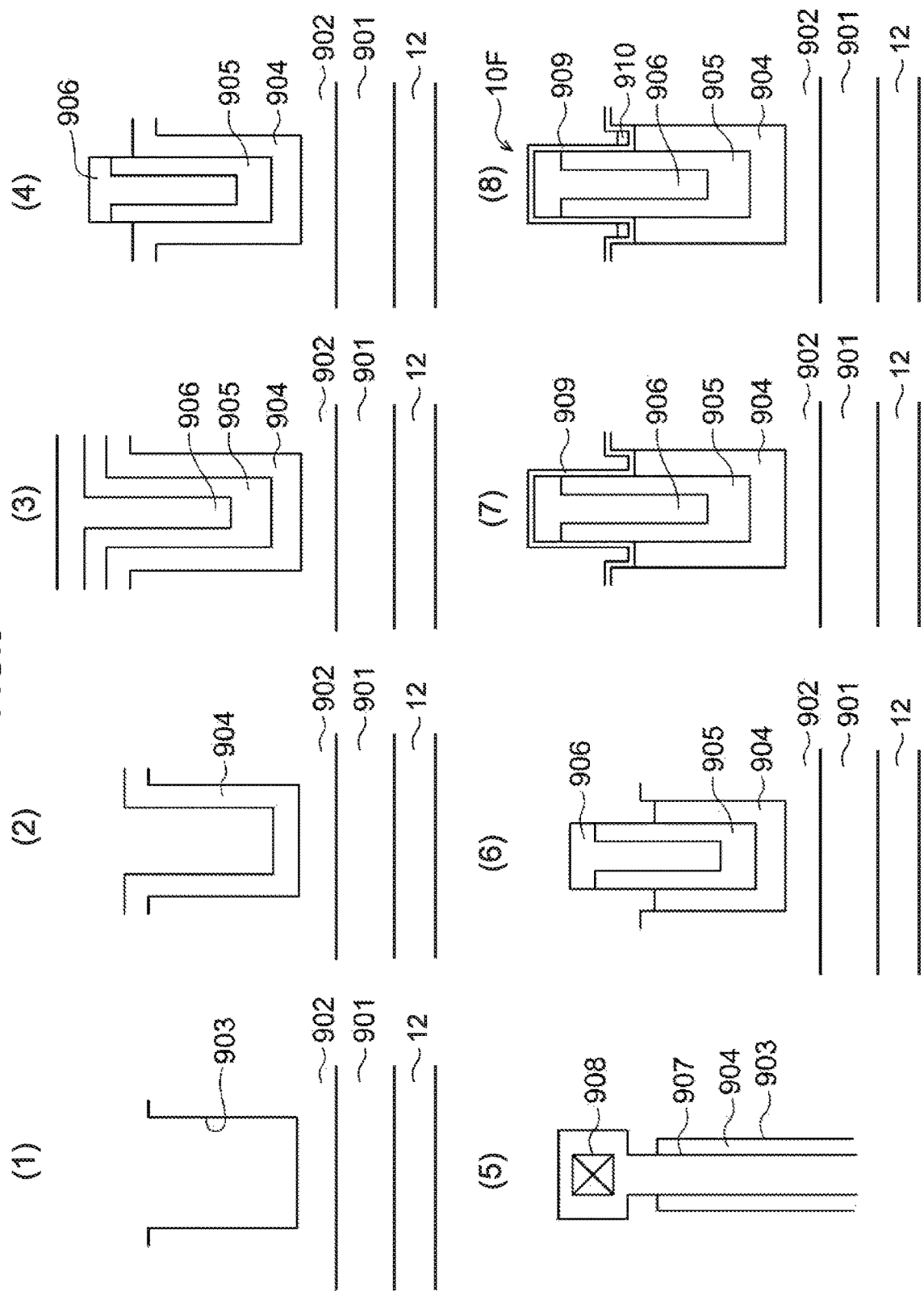
FIG. 9 is cross-sectional views illustrating manufacturing steps of a semiconductor device according to a sixth exemplary embodiment.

Next, an insulating film 904 is formed ((2) of FIG. 9). For example, a silicon oxide film (SiO2) is used as the insulating film 904, and the film thickness thereof is made to be around 2000 Å as an example.

Next, polysilicon layers that are doped with P type and N type impurities is layered, and the trenches 903 are filled-in ((3)) of FIG. 9). In the present exemplary embodiment, as an example, an N type polysilicon of a film thickness of around 2000 Å is formed, and thereafter, a P type polysilicon of a film thickness of around 2000 Å is formed. As a result, N type field plates 905 and P type field plates 906 are formed.

Next, patterning is carried out in order to obtain the desired PN layered structure ((4) of FIG. 9). (5) of FIG. 9 is a plan view of this step. In this step, structures for creating contact with the PN layered structures, i.e., PN layered field plate electrode contacts 908 and PN layered field plate electrodes 907, also are formed.

Next, the insulating film 904 is etched-back ((6) of FIG. 9).

Next, a gate oxide film 909 is formed ((7) of FIG. 9). The film thickness of the gate oxide film 909 is, for example, 1000 Å.

Next, polysilicon is formed as a film and is etched-back, and gate electrodes 910 are formed ((8) of FIG. 9). The film thickness of the polysilicon for forming the gate electrodes 910 is, for example 2000 Å.

In the present exemplary embodiment, a pair of a P type and an N type polysilicon are filled into the trenches 903, but, depending on the application, more can be layered. In such a case as well, there is the effect that is suffices to carry out a single time the etching that forms the PN layered structure.

What is claimed is:

1. A semiconductor device comprising:
    a first semiconductor layer having a first conductive type;
    a second semiconductor layer provided on the first semiconductor layer, the second semiconductor layer having a second conductive type that is a conductive type different from the first conductive type;
    an impurity region of the first conductive type formed at a surface of the second semiconductor layer;
    a first electrode adjacent to the impurity region, the second semiconductor layer, and the first semiconductor layer,
    wherein the first electrode is separated from the impurity region, the first semiconductor layer and the second semiconductor layer by an insulating film; and
    a second electrode adjacent to the first electrode and the first semiconductor layer,
    the second electrode including a PN junction at a border between an upper portion of the second electrode that is adjacent to the first semiconductor layer and a lower portion of the second electrode that is also adjacent to the first semiconductor layer,
    wherein the second electrode is separated from the first electrode and the first semiconductor layer by the insulating film,
    wherein a layered oxide film is formed at the border of the PN junction, and
    wherein the first electrode and the second electrode are disposed laterally adjacent to each other, with the insulating film therebetween, as seen in a plan view.

2. The semiconductor device of claim 1, wherein the second electrode includes a plurality of groups of the lower portion and the upper portion, wherein each group among the plurality of groups includes the PN junction at the border between the upper portion and the lower portion.

3. The semiconductor device of claim 1, wherein an upper end of the upper portion and an upper end of the lower portion projects out further than a main surface of a semiconductor substrate at which the semiconductor device is formed.

* * * * *